(12) United States Patent
Madigan et al.

(10) Patent No.: US 11,906,849 B2
(45) Date of Patent: Feb. 20, 2024

(54) QUANTUM DOT COLOR FILTER INK COMPOSITIONS AND DEVICES UTILIZING THE SAME

(71) Applicant: KATEEVA, INC., Newark, CA (US)

(72) Inventors: Conor F. Madigan, San Francisco, CA (US); Siddharth Harikrishna-Mohan, Chicago, IL (US); Florian Pschenitzka, San Francisco, CA (US); Teresa A. Ramos, San Jose, CA (US); Inna Gurevitch, Dublin, CA (US)

(73) Assignee: Kateeva, Inc., Newark, CA (US)

( * ) Notice: Subject to any disclaimer, the term of this patent is extended or adjusted under 35 U.S.C. 154(b) by 330 days.

(21) Appl. No.: 17/449,551

(22) Filed: Sep. 30, 2021

(65) Prior Publication Data
US 2022/0019109 A1 Jan. 20, 2022

Related U.S. Application Data

(62) Division of application No. 16/558,653, filed on Sep. 3, 2019, now Pat. No. 11,181,779.

(60) Provisional application No. 62/737,790, filed on Sep. 27, 2018.

(51) Int. Cl.
| | |
|---|---|
| *G02F 1/13357* | (2006.01) |
| *G02F 1/1335* | (2006.01) |
| *C09D 11/101* | (2014.01) |
| *C09D 11/037* | (2014.01) |
| *C09K 11/56* | (2006.01) |
| *C09K 11/06* | (2006.01) |

(Continued)

(52) U.S. Cl.
CPC ...... *G02F 1/133617* (2013.01); *C09D 11/037* (2013.01); *C09D 11/101* (2013.01); *C09K 11/06* (2013.01); *C09K 11/565* (2013.01); *C09K 11/70* (2013.01); *G02F 1/133504* (2013.01); *G02F 1/133516* (2013.01); *H10K 59/38* (2023.02); *C09K 2211/1011* (2013.01); *G02F 2201/52* (2013.01); *G02F 2202/106* (2013.01); *G02F 2202/107* (2013.01); *G02F 2202/108* (2013.01)

(58) Field of Classification Search
CPC ............... C09D 11/037; C09D 11/101; G02F 1/133617
See application file for complete search history.

(56) References Cited

U.S. PATENT DOCUMENTS

| | | |
|---|---|---|
| 2006/0257615 A1 | 11/2006 | Takano et al. |
| 2010/0258789 A1 | 10/2010 | Akai et al. |
| 2012/0032142 A1 | 2/2012 | Leatherdale et al. |

(Continued)

OTHER PUBLICATIONS

EP Extended Search Report dated May 16, 2022 for EP Patent Application No. 19865665.4.

(Continued)

*Primary Examiner* — James Sanders
(74) *Attorney, Agent, or Firm* — Hauptman Ham, LLP

(57) ABSTRACT

Liquid ink compositions containing quantum dots for optoelectronic display applications are provided. Also provided are solid films formed by drying the ink compositions, optical elements incorporating the solid films, display devices incorporating the optical elements, and methods of forming the solid films, optical elements, and the devices. Liquid ink compositions and solid films made by drying the liquid ink compositions include one or more blue light-absorbing materials in combination with red light-emitting QDs or green light-emitting QDs.

20 Claims, 5 Drawing Sheets

(51) Int. Cl.
C09K 11/70 (2006.01)
H10K 59/38 (2023.01)

(56) References Cited

U.S. PATENT DOCUMENTS

| | | |
|---|---|---|
| 2014/0204319 A1 | 7/2014 | Cai et al. |
| 2014/0367633 A1 | 12/2014 | Bibl et al. |
| 2015/0301408 A1 | 10/2015 | Li |
| 2017/0115561 A1 | 4/2017 | Yang et al. |
| 2018/0102449 A1 | 4/2018 | Pschenitzka et al. |

OTHER PUBLICATIONS

JP Non-Final Office Action dated Mar. 18, 2022 for JP Patent Application No. 2021-516481.
TW Examination Report dated Mar. 24, 2023 for TW Patent Application No. 108131852.
International Search Report dated Nov. 25, 2019 to International Application No. PCT/US19/49273.
Non Final Office Action dated Jan. 22, 2021 to U.S. Appl. No. 16/558,653.
Notice of Allowance dated Jul. 8, 2021 for U.S. Appl. No. 16/558,653.

QUANTUM DOT COLOR FILTER INK COMPOSITIONS AND DEVICES UTILIZING THE SAME

CROSS-REFERENCE TO RELATED APPLICATIONS

This application is a division of U.S. patent application Ser. No. 16/558,653, filed Sep. 3, 2019, which claims benefit of U.S. Provisional Patent Application No. 62/737,790 filed on Sep. 27, 2018, the entire contents of which are incorporated herein by reference.

BACKGROUND

Display technology continuously evolves with respect to improving the end-user experience. One aspect of improving the end-user experience has been to target expanding the color gamut of liquid crystal display (LCD) devices and improving the efficiency of these devices. Accordingly, quantum dot (QD) technology has been explored with respect to expanding the color gamut and improving the efficiency of these devices.

One method of improving the efficiency, color gamut, and viewing angle of an LCD panel is to replace the traditional color filter with a Quantum Dot Color Filter (QDCF). In this configuration, the QDs "filter" incoming light having a first wavelength or wavelength range, such as blue light, by converting at least a portion of it into light having a different wavelength or wavelength range, such as red light and/or green light.

In a typical red-green-blue (RGB) pixel layout-type display device with a backlight unit (BLU), the QDCF layer is disposed in the optical path between the BLU and the viewer. In the case of a standard blue light-emitting diode (LED) BLU, the QDCF layer absorbs all or a portion of the incident blue photons from the BLU and converts at least a portion of the absorbed photons into green photons and red photons in the green and red sub-pixel areas, respectively.

Unfortunately, typically at least a portion of the blue light from the BLU is transmitted through the red and green sub-pixels of the display device, leading to color contamination and a poor color gamut. This is particularly problematic for QDCF implementation in which certain types of QDs that have a small absorption cross-section in the blue region of the visible spectrum, and thereby low optical density (OD), are used. In addition, the external quantum efficiency (EQE) of a display device can be limited for QDCFs with poor forward light out-coupling.

One way of decreasing blue light leakage through a QDCF is to increase the concentration of the QDs in order to achieve increased blue light absorption and OD. The blue light absorption can be increased by increasing the thickness of the layer containing the QDs, dispersing more QDs in that layer, or both. However, increasing the thickness may compromise the viewing angle of the display by causing parallax issues and, at very high QD concentrations, re-absorption of emitted photons may occur, causing a reduction in the EQE due to a significant overlap between the QD absorption and emission. Furthermore, multiple re-absorption events may cause a spectral red shift leading to a color distortion.

SUMMARY

Optoelectronic display devices that utilize blue-light absorbing materials in combinations with QDs to improve optical performance are provided. Also provided are liquid ink compositions containing QDs for optoelectronic display applications, solid films formed from the ink compositions, and optical elements incorporating the solid films.

One embodiment of an optoelectronic display device includes: a blue light-emitting BLU; an array of pixels in the optical path of the BLU, the array of pixels comprising at least one red sub-pixel, at least one green sub-pixel, and at least one blue-sub-pixel; and a solid film comprising red-emitting QDs and a blue light-absorbing material in a red sub-pixel, a solid film comprising green-emitting quantum dots and a blue light-absorbing material in a green sub-pixel, or both. The blue light-absorbing material is characterized in that it preferentially absorbs blue light relative to red light or green light.

One embodiment of a liquid ink composition contains: 10 weight percent (wt. %) to 94.99 wt. % di(meth)acrylate monomers or a combination of di(meth)acrylate monomers and mono(meth)acrylate monomers; 4 wt. % to 10 wt. % multifunctional (meth)acrylate crosslinking agent; 1 wt. % to 50 wt. % red-emitting quantum dots or green-emitting quantum dots; and 0.01 wt. % to 85 wt. % of a blue light-absorbing material, the blue light-absorbing material characterized in that it preferentially absorbs blue light relative to red light or green light.

One embodiment of a cured film is composed of the polymerization product of the aforementioned liquid ink composition; and one embodiment of an optoelectronic device includes: a blue light source; and the aforementioned cured film in the optical path of the blue light source.

BRIEF DESCRIPTION OF THE DRAWINGS

Illustrative embodiments of the invention will hereafter be described with reference to the accompanying drawings, wherein like numerals denote like elements.

DETAILED DESCRIPTION

Liquid ink compositions containing QDs for optoelectronic display applications are provided. Also provided are solid films formed by drying and/or curing the ink compositions, optical elements incorporating the solid films, display devices incorporating the optical elements, and methods of forming the solid films, optical elements, and devices.

Liquid ink compositions and solid films made by drying the liquid ink compositions include one or more blue light-absorbing materials in combination with red light-emitting QDs or green light-emitting QDs. As used herein, the term "blue light-absorbing materials" refers to materials that have a higher absorption in the blue region of the electromagnetic spectrum than in the red and/or green regions of the electromagnetic spectrum. As such, the ink compositions and films can be used in a variety of optoelectronic devices where the filtering (i.e., absorption) of blue light is desirable.

One application of the ink compositions and films is as QD color filters for reducing or eliminating blue light leakage from red and/or green sub-pixels in an optoelectronic display device and improving their external quantum efficiencies.

Figure 1:
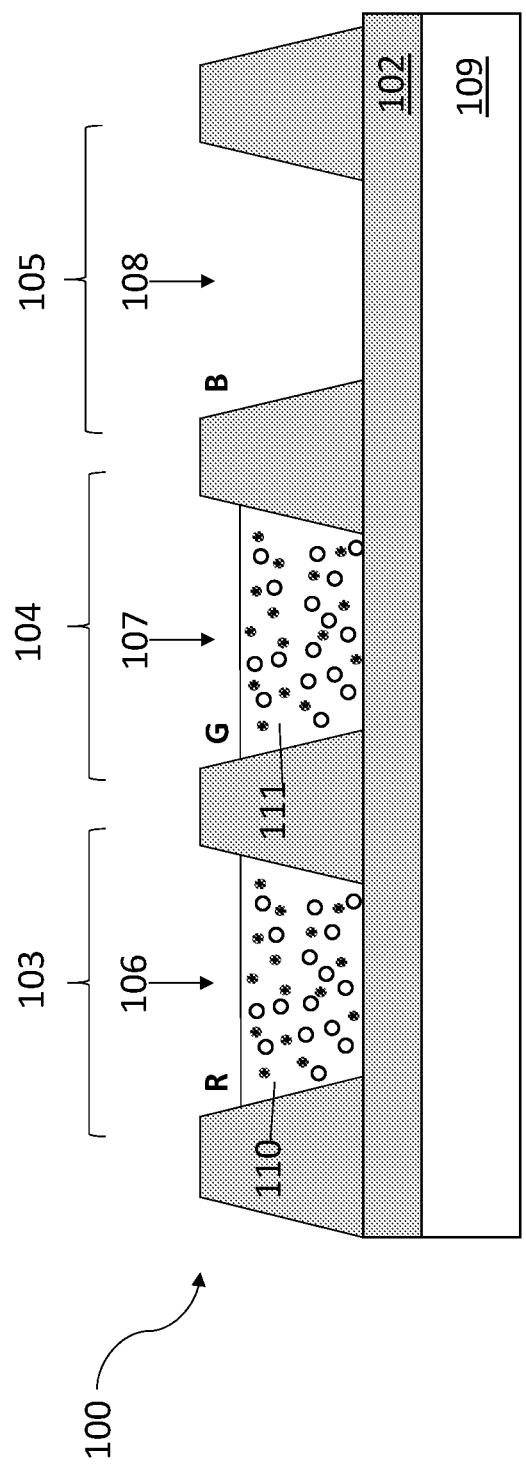
FIG. 1. Schematic diagram of a basic embodiment of an RGB pixel with an organic light emitting diode (OLED) BLU.

The color filters can be incorporated into the red and/or green sub-pixels of an RGB pixel that includes a red (R) sub-pixel, a green (G) sub-pixel, and a blue (B) sub-pixel. A basic embodiment of an RGB pixel is shown in FIG. 1. Although only a single pixel is depicted in the figure, the pixel may be part of a larger array of multiple pixels. In this embodiment, the pixel 100 includes: an optically transparent substrate 102; a red (R) sub-pixel 103; a green (G) sub-pixel 104; and a blue (B) sub-pixel 105. Each of the sub-pixels is defined by a sub-pixel well (106, 107, 108). The sub-pixel wells can be fabricated in a black matrix material using photolithography. The black matrix material separates and defines the sub-pixels and prevents light leakage between the sub-pixels. Suitable substrates upon which the black matrix material can be deposited and the sub-pixels fabricated include glass, polymers, and gallium nitride (GaN). However, other substrates can be used. The substrates may optionally include a surface coating, such as silicon nitride or polymers.

The optically transparent substrate is back lit using a BLU 109 that emits blue light. The BLU can be, for example, a blue LED with a diffuser or a blue OLED. Alternatively, the BLU can be a GaN based LED grown on a GaN substrate, in which case, the sub-pixel wells can be formed directly over the GaN substrate. As shown in FIG. 1, a single diffuse backlight can be used to illuminate all of the sub-pixels. However, it is also possible to integrate discrete micro-LEDs into the substrate beneath each sub-pixel well, such that each sub-pixel has its own blue light source. Red sub-pixel 103 includes a red QDCF layer 110 that includes red-emitting QDs (represented by solid circles) and a blue light-absorbing material (represented by open circles). Similarly, green sub-pixel 104 includes a green QDCF layer 111 that includes green-emitting QDs (represented by solid circles) and a blue light-absorbing material (represented by open circles). Although BLU 109 and substrate 102 are shown to be in direct contact in the device of FIG. 1, there may be intervening layers, provided that QDCF layers 110 and 111 are in the optical path of blue light that is emitted by BLU 109. Examples of intervening layers include capping layers, thin film encapsulation layers, and buffer layers and/or simply an air gap between adjacent layers.

Figure 2:
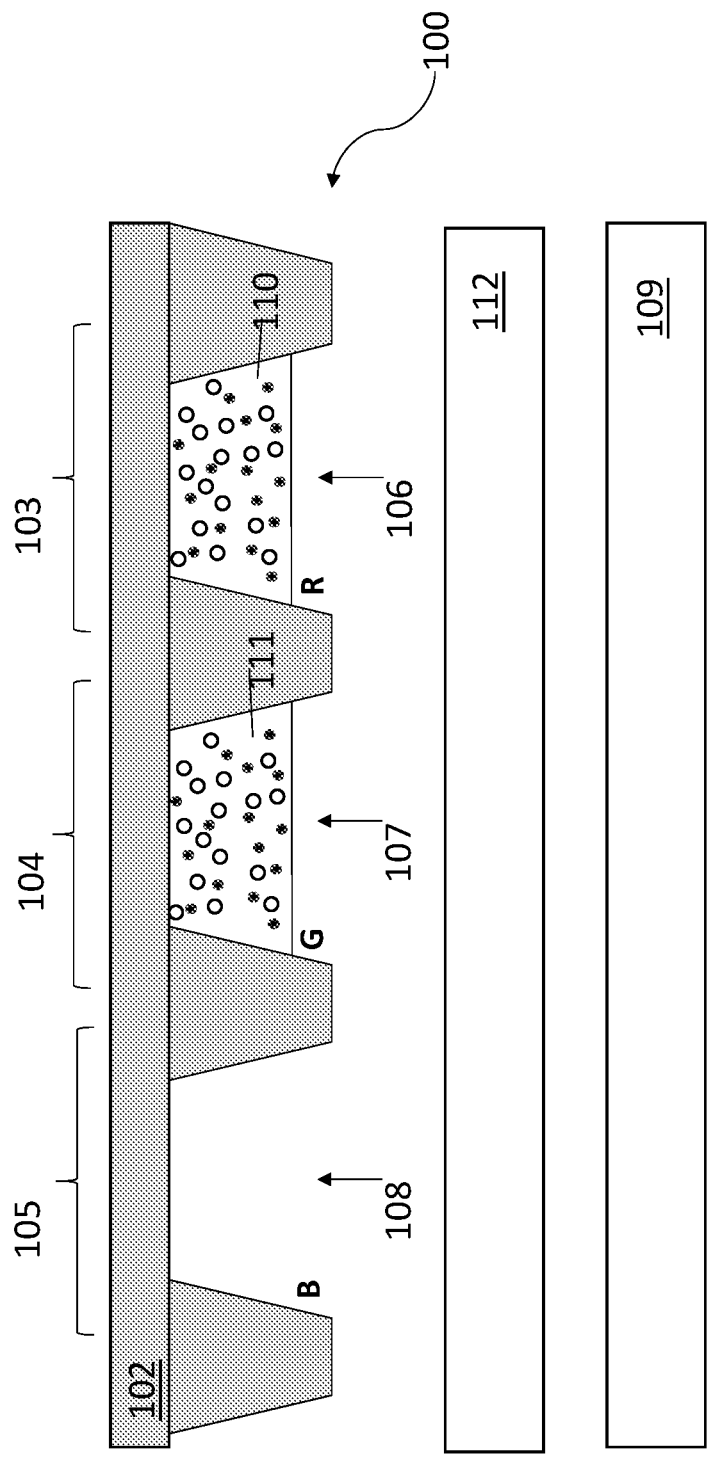
FIG. 2. Schematic diagram of an RGB pixel for an LCD device.

An embodiment of an LCD that incorporates QDCF layers is shown in FIG. 2. In this device, red sub-pixel 103, green sub-pixel 104, and blue sub-pixel 105 are illuminated by one or more blue light sources 109, such as a blue OLED, through a liquid crystal layer 112. Although not shown here, the LCD display may include intervening layers between BLU 109 and liquid crystal layer 112 or between liquid crystal layer 112 and pixel 100. Such intervening layers can include, for example, polarizers and thin film transistors and/or air gaps.

As shown in FIG. 1 and FIG. 2, the QDCF layers can be formed in a pattern by inkjet printing QD- and luminescent material-containing ink compositions into the sub-pixel wells, which confine the ink compositions. However, the use of sub-pixel wells is not required. Patterning of the QDCF layers also can be achieved by traditional photolithographic processing of a QD containing photoresist. In addition, although the blue light-absorbing materials are shown as uniformly dispersed throughout the QDCF layers in FIG. 1 and FIG. 2, they can also be provided with a concentration gradient, such that there is a higher concentration of the blue light-absorbing material at the light output side of the sub-pixel than at the BLU light input side of the sub-pixel.

The QDs are small, crystalline, inorganic particles that absorb blue light from the BLU and convert the energy of the radiation into light having a different wavelength, or a different range of wavelengths, which is emitted from the QDs within a very narrow part of the optical spectrum. The wavelengths of radiation absorbed and emitted by the QDs depend on their size. Thus, by incorporating QDs of appropriates sizes and materials in appropriate concentrations and ratios into QDCF layers, those layers can be designed to absorb blue light and convert at least a portion of it into radiation of different wavelengths. For the purposes of this disclosure, QDs that absorb blue light and convert it into red light are referred to as red-emitting QDs, and QDs that absorb blue light and convert it into green light are referred to as green-emitting QDs. The quantum dots may be composed of various semiconductors, including Group II (e.g., Zn, Cd)-VI (e.g., Se, S) semiconductors, Group III-V semiconductors, and Group IV-VI semiconductors.

The light-absorbing material may be a single material or a plurality of materials that serve the function of reducing blue light leakage from and/or enhancing the EQE of a QDCF. The blue light-absorbing materials are characterized in that they absorb ("block") light having wavelengths in the blue region of the visible spectrum (i.e., ~380 nm to ~500 nm light), but still allow light having wavelengths outside of the blue region to be transmitted. For example, the light-absorbing materials may have an absorption peak at wavelengths between 400 nm and 500 nm, including wavelengths between 420 nm and 480 nm, and further including wavelengths between 430 nm and 460 nm. The blue light-absorbing materials need not absorb 100% of the blue light in a red or green sub-pixel and need not transmit 100% of the red or green light in a red or green sub-pixel; however, the blue light-absorbing material should strongly discriminate against blue light transmission, relative to red or green light transmission.

Examples of light-absorbing materials that will aid in absorption of blue light are blue light-absorbing organic dye molecules. These organic dye molecules can have either a narrow or broad band of absorption in the blue region of the visible spectrum. The organic dye molecules desirably have a strong absorption in the blue region of the visible light spectrum and also a narrow absorption spectrum so that they don't quench the red or green light from the red-emitting and green-emitting QDs in the red and green sub-pixels. An example of one such dye is the commercially available absorber dye from Exciton, ABS454, a visible narrow band absorber. This dye has a peak absorption at 453±1 nm and a narrow absorption peak between 400 nm and 480 nm (in methylene chloride). Azo dyes are examples of blue light-absorbing organic dye molecules; however, some embodiments of the ink compositions are free of azo dyes.

In some embodiments of the QDCFs, the light-absorbing material is a luminescent material that includes a luminophore. These materials aid with blue light absorption, as well as increasing the EQE of a QDCF. The luminescent materials are characterized in that they absorb efficiently in the blue region of the visible spectrum and re-emit radiation at other wavelengths with a Stokes shift. The luminophores are the atoms or functional groups in the luminescent material that are responsible for its luminescent properties. Upon absorption of light by the luminescent materials, excitons are formed. If the energy of the excitons is transferred to a QD in a QDCF, the overall efficiency of a display device can be increased while reducing the blue light leakage. The luminescent materials can be organic materials, inorganic materials, or a combination thereof. Examples of luminescent, blue light-absorbing materials that are able to transfer energy to QDs include: organic molecules, such as coumarins, rhodamines, fluoresceins, acridines, and perylenes; phosphorescent and fluorescent dopants, including those commonly used in OLED materials, such as tris[2-phenylpyridinato-$C^2$,N]iridium(III) (Ir(ppy)$_3$), bis[2-(4,6-difluorophenyl)pyridinato-$C^2$,N](picolinato)iridium(III) (Firpic), platinum octaethylporphyrin (PtOEP), tris-(8-hydroxyquinoline) aluminum (Alq), 4-(dicyanomethylene)-2-t-butyl-6-(1,1,7,7-tetramethyljulolidyl-9-enyl)-4H-pyran (DCJTB), coumarin C545, rubrene, and the like; luminescent, blue light-absorbing polymers, such as polyfluorenes; materials incorporating lanthanide-containing luminophores, such as ZnS:Eu, ZnS:Tb, and the like; luminescent, blue light-absorbing polycyclic aromatic hydrocarbons (PAHs), such as tetracene, perylene, and derivatives of these molecules in which one or more side chains have been added or chemically modified; and QDs, wherein the QDs that act as the luminescent materials would differ from the red-emitting and green-emitting QDs of the red and green sub-pixels. Examples of commercially available coumarins that can be used in the ink compositions include Coumarin 334, Coumarin 314, and Coumarin 6, each of which have absorption peaks in the wavelength range from 430 nm to 460 nm. Some of the organic molecules, such as courmarins, are organic lasing molecules, that is—they are able to exhibit lasing action and, as such, are commonly used as laser dyes.

The exciton energy transfer process from the donor (luminescent material) to the acceptor (QD) may be long range radiative transfer, typically more than 10 nm, or short range non-radiative transfer, typically less than 10 nm.

Long range radiative energy transfer is a photon re-absorption process. In principle, this type of energy transfer can happen at an unlimited range as long as the emission spectrum of the donor and the absorption spectrum of the acceptor overlap. The energy transfer is initiated by the exciton recombination of the luminescent material which emits a photon. This photon may be absorbed by a QD due to the spectral overlap. The energy transfer rate is determined by the quantum yield of emission from the luminescent material and the absorption co-efficient of the QD.

Short range non-radiative energy transfer includes: a) Forster type; and b) Dexter type energy transfers. Forster energy transfer occurs via dipole-dipole coupling between molecules. In the beginning, the luminescent material is in an excited state and the QD is in a ground state. Transition of a photon from the luminescent material to the QD occurs when the two wave functions of the materials interact, causing the wavefunction of the QD to oscillate at the same frequency as that of the luminescent material. After the transition, the QD moves into an excited state, while the luminescent material returns to the ground state.

Forster transfer requires a spectral overlap between the donor emission and acceptor absorption. The energy transfer efficiency is highly dependent on the transfer distance and varies as the inverse sixth power of the intermolecular distance. Primary conditions enabling Forster energy transfer are: a) the luminescent material and the QD must be in close proximity (typically about 1 nm to about 10 nm); b) the absorption spectrum of the QD should overlap with the emission spectrum of the luminescent material; and c) the luminescent material and the QD transition dipole orientations must be approximately parallel.

By way of illustration, in a typical QD color filter film and at nominal QD loading conditions (eg: ~30 wt. %), the inter-molecular distance between QDs is approximately 10 nm—if the luminophore of the blue light-absorbing material is in close proximity (about 1 nm to 10 nm) to the QD and the other primary conditions for Forster transfer are satisfied, Forster energy transfer can occur as long as the energy transfer is a fast process compared to the natural decay time of the exciton of the luminescent material. For example, the decay time of the fluorescent dye Coumarin is on the order of nano-seconds, so the transfer process must be faster than that time scale.

The efficiency improvement of QDCFs will be dependent on the quantum yield of the luminescent material at the wavelength of the blue light from the BLU (e.g., at a wavelength of 450 nm), the area of spectral overlap between the luminescent material emission and QD absorption, and the intermolecular distances and lifetime decay of the luminescent material. Using these criteria for guidance, appropriate luminescent material for red-emitting and green-emitting QDs can be selected, and appropriate concentrations of the luminescent materials in the QDCFs can be identified.

The performance efficiency of the QDCFs used in the red and green sub-pixels can be characterized by their blue light transmission and by their EQEs. Blue light transmission is a measure of how much source blue light is transmitted through the QDCF or, alternatively, a measure of the OD of the QDCF at the blue region of the spectrum. A high performing QDCF layer will not allow a large fraction of the source blue light to be transmitted through the red and green sub-pixels. Any blue light leaking through these sub-pixels leads to color contamination and thus reduces the color gamut of the device. For example, to achieve a high color gamut, it is desirable that less than 1% of the blue light from the BLU be transmitted through the red and green sub-pixels. In terms of OD, this corresponds to an OD of 2 at a peak blue wavelength of 450 nm. This is a useful standard because 450 nm corresponds to the peak wavelength of standard blue LEDs that are used as BLUs in optoelectronic displays. Various embodiments of the red and/or green sub-pixels have an OD at 450 nm of at least 0.3. This includes red and/or green sub-pixels having an OD at 450 nm of at least 1.0, at least 1.1, at least 1.2, and at least 1.3. Methods of measuring blue light transmission and OD are described in the Examples.

EQE is a measure of how many of the photons emitted by the QDs in a sub-pixel exit the display device in the forward/viewing direction. EQE is defined as:

$$\frac{\text{Number of } QD \text{ photons emitted in the forward direction}}{\text{Number of source photons incident in the forward direction}}$$

Various embodiments of the films containing blue light-absorbing materials are able to provide sub-pixels with EQEs in the range from 4% to 40%; however, EQEs outside of this range can be achieved.

The QDCFs can be formed by coating a substrate with a liquid ink composition that includes the QDs and the blue light-absorbing material and drying the coating to form a solid film. The drying step may entail simply removing volatile components from the composition, such as water and/or organic solvents, by allowing them to evaporate. However, for embodiments of the ink compositions that include crosslinkable monomers and, optionally, crosslinking agents, drying may entail curing the ink composition, such that the cured film is the polymerization product of the ink composition. The final films can be quite thin, having thicknesses in the range from, for example, 5 µm to 20 µm. However, thicknesses outside of these ranges can be used.

Various embodiments of the liquid ink compositions include: one or more curable di(meth)acrylate monomers or a mixture of one or more curable di(meth)acrylate monomers with one or more mono(meth)acrylate monomers; one or more multifunctional (meth)acrylate crosslinking agents; red-emitting QDs or green-emitting QDs; and one or more blue light-absorbing materials. As used herein, the phrase "(meth)acrylate monomer" indicates that the recited monomer may be an acrylate or a methacrylate.

By way of illustration, some embodiments of the ink compositions include: (a) 10 wt. % to 94.99 wt. % di(meth)acrylate monomer or a combination of di(meth)acrylate monomer and mono(meth)acrylate monomer; (b) 4 wt. % to 10 wt. % multifunctional (meth)acrylate crosslinking agent; (c) 1 wt. % to 50 wt. % QDs; (d) 0.01 wt. % to 85 wt. % blue light-absorbing material; and, optionally, (e) 0.1 wt. % to 30 wt. % scattering particles. However, concentrations outside of these ranges can be used. For example, ink compositions having a blue light-absorbing material content in the range from 0.05 to 5.0 wt. % can be used. This includes ink compositions having a blue light-absorbing material content in the range from 0.1 to 1.0 wt. % and further includes ink compositions having a blue light-absorbing material content in the range from 0.1 to 0.5 wt. %. In such compositions, the balance of the ink composition can be adjusted by changing the amount of one or more of the other components (i.e., components (a), (b), (c), and/or (e)) in the ink compositions. In some embodiments of the ink compositions, cure initiators, such as photoinitiators or thermal initiators, are included. By way of illustration, the cure initiators can be present in amounts in the range from about 0.1 wt. % to about 20 wt. %.

The scattering particles (abbreviated SPs), may be geometric scattering particles (abbreviated GSPs), plasmonic scattering nanoparticles (abbreviated PSNPs), or a combination thereof. It should be noted that, although the PSNPs will generally have at least one nanoscale dimension—that is, at least one dimension of not greater than about 1000 nm—the nanoparticles need not be round particles. For example, the nanoparticles can be elongated particles, such as nanowires, or irregularly shaped particles. The GSPs may also be, but need not be, nanoparticles. Scattering by GSPs is accomplished by reflection, refraction, and diffraction at the surface of the particle. Examples of GSPs include metal oxide particles, such as particles of zirconium oxide (i.e., zirconia), titanium oxide (i.e., titania), and aluminum oxide (i.e., alumina). A PSNP is characterized in that incident light excites an electron density wave in the nanoparticle that creates a local oscillating electric field extending out from the surface of the nanoparticle. Examples of PSNPs include metal nanoparticles, such as nanoparticles of silver.

The ink compositions can include more than one type of SP. For example, various embodiments of the ink compositions contain a mixture of QDs and PSNP; a mixture of QDs and GSPs; or a mixture of QDs, GSPs, and PSNPs. The QD-containing ink compositions used to form a QDCF in a sub-pixel of a certain color (e.g., red or green) will include QDs that convert the light from the BLU into that color.

The GSP-containing ink compositions can include more than one type of GSP, where the different types of GSP differ by nominal particle size and/or shape, particle material, or both. Similarly, the PSNP-containing ink compositions can include more than one type of PSNP, where the different types of PSNP differ by nominal particle size and/or shape, particle material, or both.

The mono(meth)acrylate and di(meth)acrylate monomers are ether and/or ester compounds that have thin film-forming properties and that serve as a binder material upon curing. As components of a liquid ink composition, these monomers can provide compositions that are jettable at a range of inkjet printing temperatures, including room temperature. However, the liquid ink compositions can be applied by other means, including slot-die coating and spin coating. Generally, for ink compositions useful for inkjet printing applications, the surface tension, viscosity, and wetting properties of the ink compositions should be tailored to allow the compositions to be dispensed through an inkjet printing nozzle without drying onto or clogging the nozzle at the temperature used for printing (e.g., room temperature, ~22° C., or at higher temperatures up to, for example, about 70° C.). Once formulated, various embodiments of the ink compositions can have a viscosity of, for example, between about 2 cps and about 30 cps (including, for example, between about 10 cps and about 27 cps and between about 14 cps and about 25 cps) at a temperature in the range from 22° C. to 70° C. and a surface tension of between about 25 dynes/cm and about 45 dynes/cm (including, for example, between about 30 dynes/cm and about 42 dynes/cm and between about 28 dynes/cm and about 38 dynes/cm) at a temperature in the range from 22° C. to 70° C. Methods for measuring viscosities and surface tensions are well known and include the use of commercially available rheometers (e.g., a DV-I Prime Brookfield rheometer) and tensiometers (e.g., a SITA bubble pressure tensiometer).

The mono(meth)acrylate monomers and di(meth)acrylate monomers can be, for example, linear aliphatic mono(meth)acrylates and di(meth)acrylates or can include cyclic and/or aromatic groups. In various embodiments of the inkjet printable ink compositions, the mono(meth)acrylate monomers and/or di(meth)acrylate monomers are polyethers. The monomers are desirably polar, low vapor pressure monomers with relatively high boiling points.

Suitable (meth)acrylate monomers include, but are not limited to: alkyl or aryl (meth)acrylates, such as methyl (meth)acrylate, ethyl (meth)acrylate, and benzyl (meth)acrylate; cyclic trimethylolpropane formal (meth)acrylate; alkoxylated tetrahydrofurfuryl (meth)acrylate; phenoxyalkyl (meth)acrylates, such as 2-phenoxyethyl (meth)acrylate and phenoxymethyl (meth)acrylate; and 2(2-ethoxyethoxy) ethyl (meth)acrylate. Other suitable di(meth)acrylate monomers include 1,6-hexanediol diacrylate; 1,12 dodecanediol di(meth)acrylate; 1,3-butylene glycol di(meth)acrylate; di(ethylene glycol) methyl ether methacrylate; and polyethylene glycol di(meth)acrylate monomers, including ethylene glycol di(meth)acrylate monomers and polyethylene glycol di(meth)acrylate monomers having a number average molecular weight in the range from, for example, about 230 g/mole to about 440 g/mole. Other mono- and di(meth)acrylate monomers that can be included in various embodiments of the ink compositions, alone or in combination, include dicyclopentenyloxyethyl acrylate (DCPOEA), isobornyl acrylate (ISOBA), dicyclopentenyloxyethyl methacrylate (DCPOEMA), isobornyl methacrylate (ISOBMA), and N-octadecyl methacrylate (OctaM). Homologs of ISOBA and ISOBMA (collectively "ISOB(M)A" homologs) in which one or more of the methyl groups on the ring are replaced by hydrogen can also be used.

In various embodiments of the inkjet printable ink compositions, the di(meth)acrylate monomers are alkoxylated aliphatic di(meth)acrylate monomers. These include neopentyl glycol group-containing di(meth)acrylates, including alkoxylated neopentyl glycol diacrylates, such as neopentyl glycol propoxylate di(meth)acrylate and neopentyl glycol ethoxylate di(meth)acrylate. Various embodiments of the neopentyl glycol group-containing di(meth)acrylates have molecular weights in the range from about 200 g/mole to about 400 g/mole. This includes neopentyl glycol-containing di(meth)acrylates having molecular weights in the range from about 280 g/mole to about 350 g/mole and further includes neopentyl glycol-containing di(meth)acrylates having molecular weights in the range from about 300 g/mole to about 330 g/mole. Various neopentyl glycol group-containing di(meth)acrylate monomers are commercially available. For example, neopentyl glycol propoxylate diacrylate can be purchased from Sartomer Corporation under the tradename SR9003B and also from Sigma Aldrich Corporation under the tradename Aldrich-412147 (~330 g/mole; viscosity~18 cps at 24° C.; surface tension~34 dynes/cm at 24° C.). Neopentyl glycol diacrylate also can be purchased from Sigma Aldrich Corporation under the tradename Aldrich-408255 (~212 g/mole; viscosity~7 cps; surface tension~33 dynes/cm).

The multifunctional (meth)acrylate crosslinking agents desirably have at least three reactive (meth)acrylate groups. Thus, the multifunctional (meth)acrylate crosslinking agents can be, for example, tri(meth)acrylates, tetra(meth)acrylates and/or higher functionality (meth)acrylates. Pentaerythritol tetraacrylate or pentaerythritol tetramethacrylate, di(trimethylolpropane) tetraacrylate, and di(trimethylolpropane) tetramethacrylate are examples of multifunctional (meth) acrylates that can be used as a primary cross-linking agent. The term "primary" is used here to indicate that other components of the ink compositions may also participate in crosslinking, although that is not their main functional purpose.

For ink compositions that include a photoinitiator, the specific photoinitiators used for a given ink composition are desirably selected such that they are activated at wavelengths that are not damaging to materials used in the fabrication of the device. An acylphosphine oxide photoinitiator can be used, though it is to be understood that a wide variety of photoinitiators can be used. For example, but not limited by, photoinitiators from the α-hydroxyketone, phenylglyoxylate, and α-aminoketone classes of photoinitiators can also be considered. For initiating a free-radical based polymerization, various classes of photoinitiators can have an absorption profile of between about 200 nm to about 400 nm. For various embodiments of the ink compositions and methods of printing disclosed herein, 2,4,6-trimethylbenzoyl-diphenylphosphine oxide (TPO) and 2,4,6-trimethylbenzoyl-diphenyl phosphinate have desirable properties. Examples of acylphosphine photoinitiators include Irgacure® TPO (also previously available under the tradename Lucirin® TPO) initiators for UV curing, a type I hemolytic initiator with absorption at 380 nm; Irgacure® TPO-L, a type I photoinitiator that absorbs at 380 nm; Irgacure® 819 with absorption at 370 nm; and Irgacure® 907. By way of illustration, a light source emitting at a nominal wavelength in the range from 350 nm to 395 nm at a radiant energy density of up to 1.5 J/cm$^2$ could be used to cure an ink composition comprising a TPO photoinitiator. Generally, the photoinitiators will be included in amounts in the range from about 0.1 wt. % to about 20 wt. %, including amounts in the range from about 0.1 wt. % to about 8 wt. %.

Although various embodiments of the ink compositions described herein include photoinitiators, other types of initiators can be used instead of, or in addition to, the photoinitiators. For example, other suitable cure initiators include thermal initiators and initiators that induce polymerization using other types of energy, such as electron beam initiators.

Ink compositions will further include red-emitting QDs or green-emitting QDs and, optionally, SPs dispersed in the organic binder material. The QDs optionally include a surface film of capping ligands. These capping ligands, which help to passivate the QDs and stabilize them against agglomeration, are frequently present as a result of the solution phase growth of the QDs. In addition, a second type of ligand, referred to herein as a crosslinkable ligand, may be included in the QD-containing ink compositions. The crosslinkable ligands attach to the QDs, typically via hydrogen bond formation, and also covalently crosslink to the polymer components in the ink composition as it cures. The crosslinkable ligands are monomers characterized in that they have one or more functional groups with polymerizable double bonds, such as acrylate or methacrylate groups, and a functional group which undergoes specific attachment to the surfaces of the QDs in the ink composition. The monomers may further include a spacer chain separating these functional groups. Such bi-functionality of the crosslinkable ligands keeps the QDs dispersed in the curable ink compositions and prevents their re-aggregation during the curing process. For example, monomers containing carboxyl (—COOH), amine (—NR$_2$, where R is an H atom or an alkyl group), and thiol (—SH) groups have strong binding affinities for QDs composed of group II-VI elements. 2-Carboxyethyl acrylate (2CEA) is an example of a crosslinkable ligand for use with octadecylamine-capped core-shell CdSe/ZnS QDs.

In some embodiments of the ink compositions, organic solvents can be added to adjust the viscosities and/or surface tension of the ink compositions and/or to enable a high QD concentration. Suitable organic solvents include esters and ethers. Examples of organic solvents that can be included in the ink compositions include high boiling organic solvents, including organic solvents having a boiling point of at least 200° C. This includes organic solvents that have boiling points of at least 230° C., at least 250° C., or even at least 280° C. Diols and glycols, such as propanediols, pentanediols, diethylene glycols, and triethylene glycols, are examples of high boiling organic solvents that can be used. High boiling aprotic solvents can also be used, including aprotic solvents having boiling points of at least 240° C. Sulfolane, 2,3,4,5-tetrahydrothiophene-1,1-dioxide, also known as tetramethylene sulfone, is an example of a relatively high boiling, aprotic solvent. Other non-limiting exemplary organic solvents can include xylenes, mesitylene, propylene glycol methyl ethers, methyl naphthalene, methyl benzoate, tetrahydronaphthalene, dimethyl formamide, terpineol, phenoxyethanol, and butyrophenone. If organic solvents are included in the ink compositions, the QD and monomer concentrations cited above are based on the solids content of the ink compositions.

Jettable ink compositions of the type that may be used to print one or more of the polymeric layers with the addition of QDs and luminescent materials are described in U.S. patent application publication number 2016/0024322 filed on Jul. 22, 2015, U.S. patent application publication number 2017/0062762 filed on Jul. 19, 2016, U.S. patent application publication number 2018/0102449, and PCT application publication number WO 2018/017541 filed on Jul. 18, 2017, the entire contents of which are incorporated herein by reference.

The ink compositions can be printed in ambient air in an inert environment using a printing system, such as that described in U.S. Pat. No. 8,714,719, which is incorporated herein in its entirety. The films can be cured in ambient air or in an inert environment using UV radiation, thermal energy, or other forms of energy (e.g., e-beam). During curing, volatile components in the ink compositions, such as solvents, are removed and curable monomers are polymerized into polymer chains to form a cured film.

EXAMPLES

Example 1: Ink Compositions Containing Perylene Dyes and Films Formed Therefrom To illustrate the improvements that can achieved by including light-absorbing materials in a red sub-pixel, two QDCF ink compositions were formulated: Ink A and Ink B. Ink A, which is used as a reference, is an ultraviolet (UV) curable ink containing red-emitting QDs. Ink B has similar composition to that of Ink A but includes 1 wt. % of the perylene derivative dye, Lumogen F Yellow 083, as a blue light-absorbing material.

QDs: The red-emitting QDs were InP/ZnS QDs functionalized with hydrophilic ligands purchased from Nanosys.

Luminescent Material: The Lumogen F Yellow 083 was purchased from BASF. Lumogen F Yellow 083 has absorption in the blue wavelengths region of the visible spectrum with an absorption maximum around 476 nm in dichloromethane. The dye has multiple emission peaks, with a peak maximum at 496 nm in dichloromethane.

UV curable ink composition: The UV curable ink composition was formulated by mixing 90 wt. % benzyl methacrylate monomer, 7 wt. % pentaerythritol tetraacrylate (PET)—crosslinking agent, and 3 wt. % of the photoinitiator TPO. A stock solution of the composition was prepared and stored.

Base Red Ink Composition: 170 mg of the dried red QD concentrate was added to 1 ml of the UV curable ink composition and left on a roller overnight. This composition was then filtered using 0.45 μm Nylon membrane. The final concentration of red QD in the base red ink composition was 15 wt. %.

Base Luminophore Ink Composition: 200 mg of Lumogen F Yellow 083 yellow dye powder was added to 10 ml of the UV curable ink composition. The resulting solution was stirred on a magnetic stirrer for 4 hours until the dye was completely dissolved. The final concentration of the dye was ~2 wt. %.

Ink A (Comparative): In a separate vial, 0.2 ml of the base red ink composition was diluted with 0.2 ml of the UV curable ink composition. The final composition of Ink A was approximately 7.8 wt. % ligand-capped InP/ZnS QDs, approximately 83 wt. % benzyl methacrylate monomer, 6.5 wt. % PET, and 2.7 wt. % TPO.

Ink B (Working Example): In a separate vial, 0.2 ml of the base luminophore ink composition and 0.2 ml of the base red ink composition were mixed. The resulting solution was stirred on a magnetic stirrer for 4 hours to ensure adequate mixing. The final composition of Ink B was approximately 7.8 wt. % ligand-capped InP/ZnS QDs, 1 wt. % Lumogen F Yellow 083, approximately 82 wt. % benzyl methacrylate, 6.5 wt. % PET, and 2.7 wt. % L-TPO.

QDCF Films: QDCF films were made on glass slides with dimensions of 50 mm×50 mm. The substrates were treated with UV ozone for 15 minutes prior to coating with Ink A or Ink B via doctor blading. Ink A was used to fabricate QDCF Film A, and Ink B was used to fabricate QDCF Film B. The wet film target thickness was ~12 μm. The wet films were subsequently cured for 2 minutes under 395 nm LED excitation in a nitrogen environment. The films appeared well cured.

Figure 3:
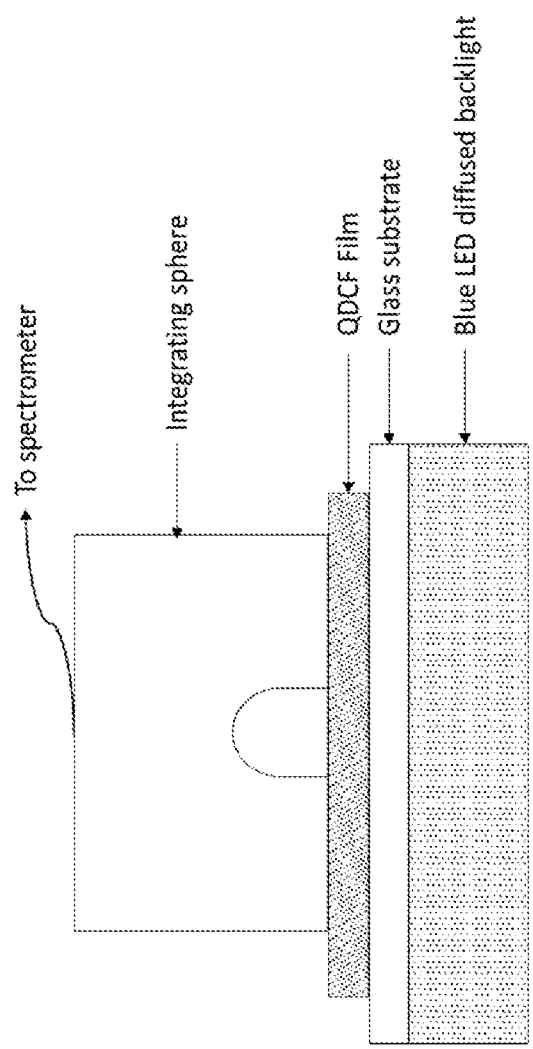
FIG. 3. Optical characterization setup used in the Example.

Optical Characterization: A schematic of an in-house developed optical characterization setup is shown in FIG. 3. A series of blue LEDs with a diffuser was used as a BLU. The substrate coated with the QDCF film was placed on the top of the LED BLU and an Ocean Optics integrating sphere (FOIS-1) was placed on top of the sample to capture all the light in the forward direction. The captured light contains both the blue light transmitted through the glass substrate and the QDCF film and the emission from the QDs. The integrating sphere was coupled to an Ocean Optics JAZ series spectrometer (with a fiber optic cable) which was interfaced to a PC with Spectra Suite software. The spectral integral of the QD emission area to the spectral integral of the blue LED reference spectrum measured in the forward direction was the EQE. The OD at 450 nm was calculated from the blue light transmission values through the films as follows: $OD=2-\log (100*\% T_{QDCF}/\% T_{substrate})$.

Experimental Results:

QDCF Film A (comparative): The reference spectrum of blue LED through a bare glass substrate ("Blue LED") and the actual spectrum through QDCF Film A ("Blue LED+QDCF") is shown in FIG. 4.

Film B (working example): The reference spectrum of blue LED through a bare glass substrate ("Blue LED") and the actual spectrum through QDCF Film B ("Blue LED+QDCF") is shown in FIG. 5.

Figure 4:
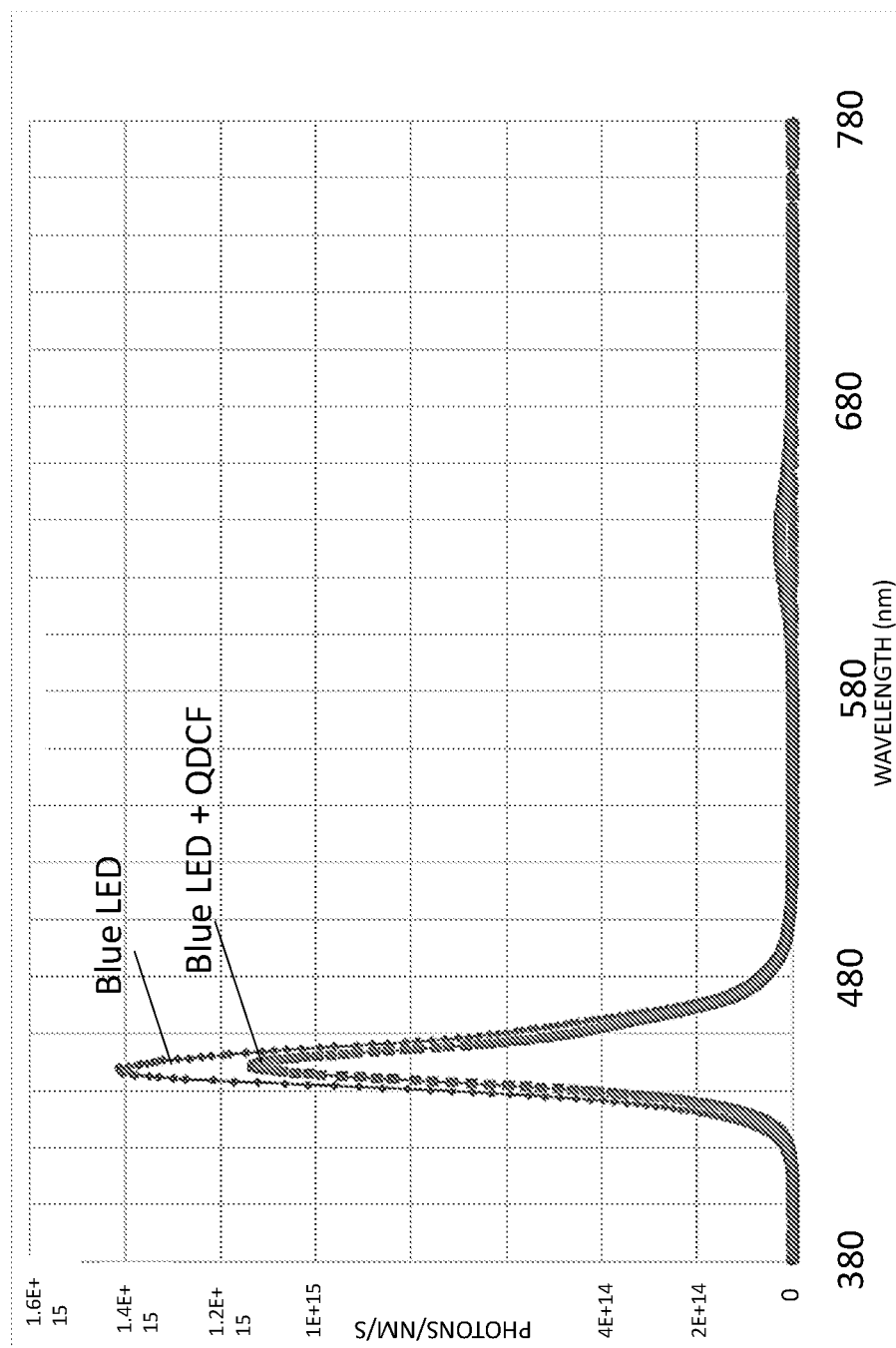
FIG. 4. The reference spectrum of a blue LED through a bare glass substrate ("Blue LED") and the actual spectrum through QDCF Film A in the Example.
Figure 5:
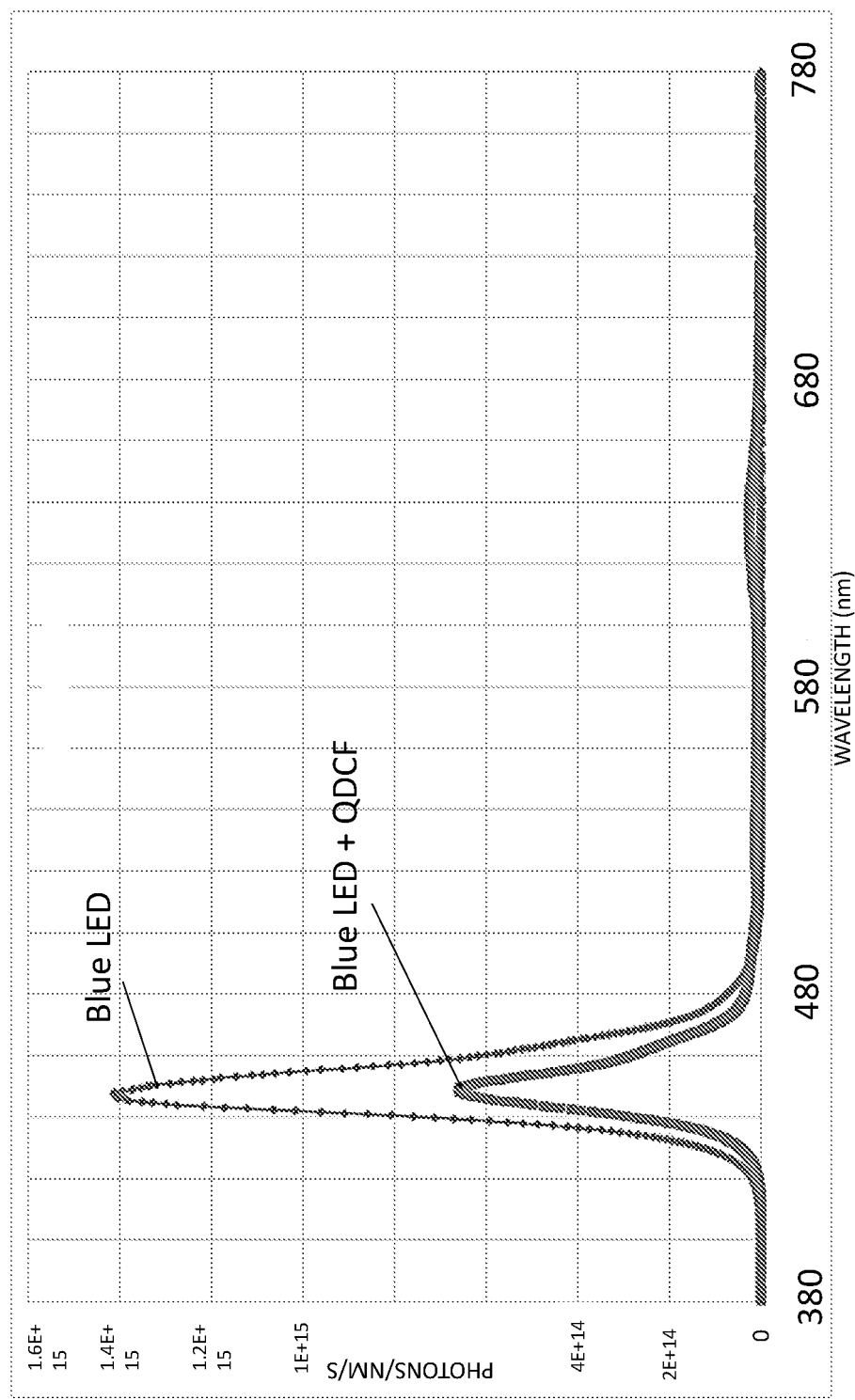
FIG. 5. The reference spectrum of blue LED through a bare glass substrate ("Blue LED") and the actual spectrum through QDCF Film B in the Example.

As seen from FIG. 4 and FIG. 5, the transmitted blue light intensity through QDCF Film B is approximately 50% of that through QDCF Film A. The results are tabulated in Table 1 below.

TABLE 1

Summary of QDCF film performance.

| Quantum Dot Color Filter Film | Optical density at 450 nm | Film thickness (um) | Normalized* Optical density at 450 nm | EQE (%) |
|---|---|---|---|---|
| A- Comparative | 0.13 | 7 | 0.18 | 4.4 |
| B- Inventive | 0.36 | 10 | 0.36 | 4.5 |

Since the comparative film was thinner than the inventive film (7 μm vs 10 μm), the OD was also normalized to 10 μm thickness and tabulated. As seen, the QDCF Film B had a normalized OD of 0.36 compared to 0.18 for QDCF Film A.

Example 2: Ink Compositions Containing Coumarin Dyes and Films Formed Therefrom To illustrate the improvements that can achieved by including light-absorbing materials in a green sub-pixel, four QDCF ink compositions were formulated: Ink A2, Ink B2, Ink C2, and Ink D2. Ink A2, which is used as a reference, is a UV curable ink containing green-emitting QDs. Inks B2, C2, and D2 had similar compositions to that of Ink A but included 0.15 wt. % to 0.24 wt. % coumarin as a blue light-absorbing material.

QDs: The green-emitting QDs were purchased from Nanosys.

Blue Light-Absorbing Material: Coumarin 334, Coumarin 314, and Coumarin 6 were purchased from Sigma Aldrich, for the B2, C2, and D2 ink compositions, respectively. The coumarins have absorption in the blue wavelengths region of the visible spectrum with an absorption maximum in the wavelength range from 430 nm to 460 nm.

The formulations for ink compositions A2 (comparative), B2, C2, and D2 are shown in Table 2.

TABLE 2

Ink Composition Formulations

| QD Ink | Blue Light-Absorbing Material | Benzyl Methacrylate (wt. %) | PET (wt.%) | Irgacure 907 (wt. %) | Green QDs | TiO₂ (scattering particles) (wt. %) | Coumarin (wt. %) |
|---|---|---|---|---|---|---|---|
| Ink A2 | None | 55.6 | 4.3 | 7.1 | 28 | 5 | None |
| Ink B2 | Coumarin 334 | 55.45 | 4.3 | 7.1 | 28 | 5 | 0.15 |
| Ink C2 | Coumarin 314 | 55.45 | 4.3 | 7.1 | 28 | 5 | 0.15 |
| Ink D2 | Coumarin 6 | 55.36 | 4.3 | 7.1 | 28 | 5 | 0.24 |

QDCF Films: QDCF films were made according to the procedures described in Example 1.

Optical Characterization: The optical properties of the QDCF films were characterized as described in Example 1, and the results are reported in Table 3.

TABLE 3

Summary of QDCF film performance.

| Quantum Dot Color Filter Film | Optical density at 450 nm | Film thickness (μm) | EQE (%) |
|---|---|---|---|
| A2 | 0.9 | 10 | 38 |
| B2 | 1.1 | 10 | 32 |
| C2 | 1.1 | 10 | 32.5 |
| D2 | 1.35 | 10 | 37 |

The word "illustrative" is used herein to mean serving as an example, instance, or illustration. Any aspect or design described herein as "illustrative" is not necessarily to be construed as preferred or advantageous over other aspects or designs. Further, for the purposes of this disclosure and unless otherwise specified, "a" or "an" means "one or more."

The foregoing description of illustrative embodiments of the invention has been presented for purposes of illustration and of description. It is not intended to be exhaustive or to limit the invention to the precise form disclosed, and modifications and variations are possible in light of the above teachings or may be acquired from practice of the invention. The embodiments were chosen and described in order to explain the principles of the invention and as practical applications of the invention to enable one skilled in the art to utilize the invention in various embodiments and with various modifications as suited to the particular use contemplated. It is intended that the scope of the invention be defined by the claims appended hereto and their equivalents.

What is claimed is:

1. A method of forming a color filter for an optoelectronic device having a blue light source, the method comprising:
   depositing an ink composition on a substrate that is in the optical path of the blue light source; and
   curing the ink composition into a solid film, the ink composition comprising:
   10 wt. % to 94.99 wt. % di(meth)acrylate monomers or a combination of di(meth)acrylate monomers and mono(meth)acrylate monomers;
   4 wt. % to 10 wt. % multifunctional (meth)acrylate crosslinking agent;
   1 wt. % to 50 wt. % red-emitting quantum dots or green-emitting quantum dots; and
   0.01 wt. % to 85 wt. % of a blue light-absorbing material, the blue light-absorbing material characterized in that it preferentially absorbs blue light relative to red light or green light, wherein the solid film has an optical density, at a wavelength of 450 nm, of at least 1.0.

2. The method of claim 1, wherein the solid film further comprises scattering particles.

3. The method of claim 2, wherein the blue light-absorbing material comprises organic molecules.

4. The method of claim 3, wherein the organic molecules comprise coumarin molecules.

5. The method of claim 1, wherein the blue light-absorbing material comprises an inorganic material.

6. The method of claim 1, wherein the blue light-absorbing material comprises a luminophor.

7. The method of claim 6, wherein the blue light-absorbing material is selected from phosphorescent dopant molecules, fluorescent dopant molecules, phosphorescent polymer molecules, fluorescent polymer molecules, semiconductor quantum dots, lanthanide-containing compounds, polycyclic aromatic hydrocarbons, and combinations of two or more thereof.

8. The method of claim 1, wherein the solid film has an optical density, at a wavelength of 450 nm, of at least 1.3.

9. A method of forming a color filter for an optoelectronic device having a blue light source, the method comprising:
   depositing an ink composition on a substrate that is in the optical path of the blue light source; and
   curing the ink composition into a solid film having red sub-pixels and green sub-pixels, the ink composition comprising:
   10 wt. % to 94.99 wt. % di(meth)acrylate monomers or a combination of di(meth)acrylate monomers and mono(meth)acrylate monomers;
   4 wt. % to 10 wt. % multifunctional (meth)acrylate crosslinking agent;
   1 wt. % to 50 wt. % red-emitting quantum dots for the red sub-pixels and 1 wt. % to 50 wt. % green-emitting quantum dots for the green sub-pixels; and
   0.01 wt. % to 85 wt. % of a blue light-absorbing material, the blue light-absorbing material characterized in that it preferentially absorbs blue light relative to red light or green light, wherein the solid film has an optical density, at a wavelength of 450 nm, of at least 1.0.

10. The method of claim 9, wherein the blue light-absorbing material is present in each of the red sub-pixels, the green sub-pixels, or both, in a concentration gradient with a higher concentration of the blue light-absorbing material at the light output side of each sub-pixel than at the light input side of the sub-pixel.

11. The method of claim 9, wherein the blue light absorbing material is one or more components selected from the group consisting of phosphorescent dopant molecules, fluorescent dopant molecules, fluorescent polymer molecules, phosphorescent polymer molecules, and polycyclic aromatic hydrocarbons.

12. The method of claim 9, wherein the red sub-pixels, the green sub-pixels, or both further comprise scattering particles.

13. The method of claim 9, wherein the blue light-absorbing material comprises organic molecules.

14. The method of claim 13, wherein the organic molecules comprise coumarin molecules.

15. The method of claim 9, wherein the solid film has an optical density, at a wavelength of 450 nm, of at least 1.3.

16. The method of claim 9, wherein the ink composition further comprises 0.1 wt. % to 30 wt. % scattering particles.

17. The method of claim 9, wherein the blue light source is a backlight unit of an optoelectronic display device.

18. A method of forming a color filter for an optoelectronic device having a blue light source, the method comprising:
depositing an ink composition on a substrate that is in the optical path of the blue light source to form a first layer containing red-emitting quantum dots, a second layer containing green-emitting quantum dots, and a third layer containing a blue light-absorbing material; and
curing the deposited layers into a solid film having red sub-pixels and green sub-pixels, the ink composition comprising:
10 wt. % to 94.99 wt. % di(meth)acrylate monomers or a combination of di(meth)acrylate monomers and mono(meth)acrylate monomers;
4 wt. % to 10 wt. % multifunctional (meth)acrylate crosslinking agent;
1 wt. % to 50 wt. % red-emitting quantum dots for the red sub-pixels and 1 wt. % to 50 wt. % green-emitting quantum dots for the green sub-pixels; and
0.01 wt. % to 85 wt. % of a blue light-absorbing material, the blue light-absorbing material characterized in that it preferentially absorbs blue light relative to red light or green light, wherein the solid film has an optical density, at a wavelength of 450 nm, of at least 1.0.

19. The method of claim 18, wherein the ink composition further comprises 0.1 wt. % to 30 wt. % scattering particles.

20. The method of claim 18, wherein the solid film has an optical density, at a wavelength of 450 nm, of at least 1.3.

* * * * *